(12) United States Patent
Eun Lee et al.

(10) Patent No.: US 7,471,159 B2
(45) Date of Patent: Dec. 30, 2008

(54) PHASE-LOCKED LOOP FOR STABLY ADJUSTING FREQUENCY-BAND OF VOLTAGE-CONTROLLED OSCILLATOR AND PHASE LOCKING METHOD

(75) Inventors: Jung Eun Lee, Seongnam-si (KR); Chun Deok Suh, Yongin-si (KR); Hoon Tae Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 103 days.

(21) Appl. No.: 11/595,887

(22) Filed: Nov. 13, 2006

(65) Prior Publication Data

US 2007/0121774 A1 May 31, 2007

(30) Foreign Application Priority Data

Nov. 25, 2005 (KR) ............ 10-2005-0113217

(51) Int. Cl.
*H03L 7/08* (2006.01)
*H03L 7/095* (2006.01)
*H03L 7/099* (2006.01)
*H03L 7/10* (2006.01)

(52) U.S. Cl. .............. 331/17; 331/25; 331/DIG. 2

(58) Field of Classification Search ............ 331/1 A, 331/8, 10–12, 14, 16–18, 25, DIG. 2; 327/156–159; 329/325; 332/127; 360/51; 375/376; 455/260
See application file for complete search history.

(56) References Cited

U.S. PATENT DOCUMENTS

| 5,331,292 | A | * | 7/1994 | Worden et al. ............ 331/1 A |
| 5,382,922 | A | * | 1/1995 | Gersbach et al. ......... 331/1 A |
| 5,610,560 | A | * | 3/1997 | Sauer et al. .............. 331/8 |
| 5,923,196 | A | | 7/1999 | Okamoto |
| 6,683,502 | B1 | * | 1/2004 | Groen et al. .............. 331/17 |
| 6,803,830 | B2 | * | 10/2004 | Scheffler ................. 331/36 C |
| 6,806,786 | B1 | * | 10/2004 | Lam et al. ................ 331/179 |
| 6,903,613 | B1 | * | 6/2005 | Mitchell et al. ........... 331/11 |

FOREIGN PATENT DOCUMENTS

| JP | 10-308666 A | 11/1998 |
| JP | 2000-138660 A | 5/2000 |
| JP | 2001-16103 A | 1/2001 |
| JP | 2001-251185 A | 9/2001 |
| JP | 2001-251186 A | 9/2001 |
| JP | 2004-7433 A | 1/2004 |
| KR | 2000-0022625 A | 4/2000 |
| KR | 10-2001-0017604 A | 3/2001 |

(Continued)

*Primary Examiner*—David Mis
(74) *Attorney, Agent, or Firm*—Sughrue Mion, PLLC

(57) ABSTRACT

A phase-locked loop (PLL) for stably adjusting a frequency band of a voltage-controlled oscillator and a phase locking method. In the PLL, a frequency band controller alters the frequency band selection digital value in response to an input clock signal and an oscillation control signal generated from an LPF of a basic PLL circuit, and thus a voltage-controlled oscillator of the basic PLL circuit alters the frequency of an output clock signal in response to the oscillation control signal and the frequency band selection digital value. The output clock signal is rapidly and stably phase-locked at a target frequency depending on the frequency band selection digital value.

16 Claims, 11 Drawing Sheets

FOREIGN PATENT DOCUMENTS

| KR | 10-2002-0012406 A | 2/2002 |
| KR | 10-2002-0020187 A | 3/2002 |
| KR | 20020046482 A | 6/2002 |
| KR | 10-2004-0055085 A | 6/2004 |
| KR | 1020050037034 A | 4/2005 |

* cited by examiner

PHASE-LOCKED LOOP FOR STABLY ADJUSTING FREQUENCY-BAND OF VOLTAGE-CONTROLLED OSCILLATOR AND PHASE LOCKING METHOD

CROSS-REFERENCE TO RELATED PATENT APPLICATION

This application claims priority from Korean Patent Application No. 10-2005-0113217, filed on Nov. 25, 2005, in the Korean Intellectual Property Office, the disclosure of which is incorporated herein in its entirety by reference.

BACKGROUND OF THE INVENTION

1. Field of the Invention

Apparatuses and methods consistent with the present invention relates to a phase-locked loop (PLL), and more particularly, to a phase-locked loop for stably adjusting a frequency band of a voltage-controlled oscillator and a phase locking method.

2. Description of Related Art

FIG. 1 is a block diagram illustrating the inner construction of a related art phase-locked loop (PLL) 100.

Referring to FIG. 1, the PLL 100 includes a phase/frequency detector (PFD) 110, a charge pump (CP) 120, a low-pass filter (LPF) 130, a voltage-controlled oscillator (VCO) 140, a frequency divider 150, and a frequency band selector 160.

The PLL 100 receives an input clock signal CLK1 and outputs an output clock signal CLK2 having a frequency higher or lower than that of the input clock signal CLK1. The PFD 110 compares the input clock signal CLK1 with an output signal which is fed back to the PFD 110 from the VCO 140 via the frequency divider 150, and generates a comparison result output signal in accordance with the phase and frequency difference between the input clock signal CLK1, and the output signal fed back via the frequency divider 150. Then, the compared output signal is processed in the CP 120 and the LPF 130, which subsequently provides a control voltage VCTRL to the VCO 140. At this time, the VCO 140 is phase-locked at a certain frequency by the control voltage VCTRL. By such a feedback operation, a frequency band of the output clock signal CLK2, which is phase-locked in the VCO 140, is adjusted to have a certain target frequency (FVCO) in accordance with the operation of a frequency band selector 160. Such a disclosure is described in detail in Japanese Patent Laid-Open Publication No. 2001-251186.

FIG. 2 is a graph illustrating the operating frequency band of the VCO 140 of FIG. 1.

Referring to FIG. 2, the frequency band of the output clock signal CLK2 from the VCO 140 is determined by output digital values 000 to 111 of the frequency band selector 160 in accordance with the control voltage VCTRL. When the control voltage VCTRL output from the LPF 130 reaches a target voltage VT, the frequency of the output clock signal CLK2 is phase-clocked at the target frequency FVCO within a corresponding frequency band.

For example, as shown in FIG. 3, when the control voltage VCTRL fluctuates between VL and VH over time, the VCO 140 alters the frequency band of the output clock signal CLK2 thereof depending on the output digital values of the frequency band selector 160 several times. The frequency band selector 160 allows the frequency band of the output clock signal CLK2 to alter to a high frequency band or a low frequency band at a time point where the control voltage VCTRL is larger than VH or is smaller than VL. Generally, like the waveform 310, after the frequency band of the output clock signal CLK2 of the VCO 140 has gone through a period of ringing/fluctuation, the control voltage VCTRL reaches the target voltage VT and the frequency of the output clock signal CLK2 is phase-locked at the target frequency FVCO.

In the PLL 100, a ringing/fluctuation may exist in the control voltage VCTRL, as shown in FIG. 3, depending on a manufacturing condition or an operation temperature when a circuit is fabricated in slightly different environments. However, such a related PLL has a shortcoming in that like the waveform 320, if the frequency band is changed each time the ringing/fluctuation peak exceeds a threshold VL/VH, the control voltage VCTRL does not reach the target voltage VT and the frequency of the output clock signal CLK2 is not phase-locked at the certain target frequency FVCO.

In addition, for the PLL 100 there occurs a problem in that if a response time of basic PLL circuits 110 to 150 as shown in FIG. 1 is not taken into consideration, the frequency of the output clock signal CLK2 is not phase-locked at the certain target frequency FVCO since the response time of basic PLL circuits 110 to 150 is longer than a response time of the frequency band selector 160. For example, the time spent for the frequency band selector 160 to change the output thereof for the purpose of changing the frequency band of the output clock signal CLK2 is short at an interval where the ringing/fluctuation peak goes beyond the threshold VL/VH, but the time spent for the control voltage VCTRL to be output from the LPF 130 by reflecting this is as long as the time spent for the feedback operation of the basic PLL circuit 110 to 150. Therefore, the output of the frequency band selector 160 for the purpose of changing the frequency band of the output clock signal CLK2 is changed again prior to its reflection of the control voltage VCTRL at an interval where the ringing/fluctuation peak goes beyond the threshold VL/VH, thereby making the phase-locking of the frequency of the output clock signal CLK2 unstable.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a PLL which can sufficiently secure an operating bandwidth of a VCO so as to be adopted regardless of a fabricating process or an operation temperature of a circuit as well can stably adjust a frequency band of the VCO in consideration of the response time for selection of an operating frequency band to be fed back to the VCO as so as to secure stability of the phase-locking of the frequency of an output clock signal from the VCO.

The present invention also provides a phase locking method which can stably adjust the frequency band of a VCO depending on a predetermined response time set for selection of an operating frequency band of the VCO According to one aspect of the present invention, there is provided a PLL including: a basic PLL circuit for generating an output clock signal which is phase-locked with an input clock signal by using a VCO for oscillating in response to an oscillation control signal and changing an oscillation frequency band depending on a frequency band selection digital value; and a frequency band controller for deciding the frequency band selection digital value in response to the input clock signal and the oscillation control signal.

The frequency band controller may include: a comparator for comparing the oscillation control signal with a first reference voltage to generate an up-count signal according to a comparison result, and comparing the oscillation control signal with a second reference voltage to generate a down-count signal according to a comparison result; a stabilization controller for generating an enable signal to update an operating frequency region of the VCO in response to the input clock signal and the oscillation control signal; and an up/down counter for selectively outputting the up-count signal applied thereto from the comparator in response to the enable signal so as to increment the frequency band selection digital value in response to the output up-count signal, and selectively outputting the down-count signal applied thereto from the comparator in response to the enable signal so as to decrement the frequency band selection digital value in response to the output down-count signal.

The stabilization controller may include: a critical time generator for counting the input clock signal to generate at least one critical time period; a frequency band excess time calculator for calculating an interval where the oscillation control signal is higher than the first reference voltage or lower than the second reference voltage; a frequency band update decision section for determining the operating frequency region of the VCO to be updated according to the generated at least one critical time period and the calculated interval; and an up/down decision section for generating the enable signal which is activated at a certain time point when the oscillation control signal goes beyond a corresponding frequency region based on the decided operating frequency region of the VCO.

The frequency band controller may include: a comparator for comparing the oscillation control signal and a first reference voltage to generate an up-count signal according to a comparison result, and comparing the oscillation control signal and a second reference voltage to generate a down-count signal according to a comparison result; a stabilization controller for selectively outputting a part of the up-count signal and selectively outputting a part of the down-count signal depending on at least one critical time period generated on a basis of the input clock signal; and an up/down counter for incrementing the frequency band selection digital value in response to the output up-count signal and decrementing the frequency band selection digital value in response to the output down-count signal.

According to another aspect of the present invention, there is provided a method of phase-locking an input clock signal by using a VCO which is operated in response to an oscillation control signal and a frequency band selection digital value, the method comprises the steps of: receiving an input clock signal; allowing a basic PLL circuit including the VCO to process the input clock signal and an output clock signal which is fed back from the VCO to generate the oscillation control signal; deciding the frequency band selection digital value in response to the input clock signal and the oscillation control signal; and changing an oscillation frequency band of the VCO depending on the decided frequency band selection digital value to thereby generate the output clock signal whose frequency is phase-locked at a certain target frequency.

BRIEF DESCRIPTION OF THE DRAWINGS

The above and/or other aspects of the present invention will become apparent and more readily appreciated from the following detailed description of exemplary embodiments, taken in conjunction with the accompanying drawings of which.

DETAILED DESCRIPTION OF EXEMPLARY EMBODIMENTS OF THE INVENTION

Figure 1:
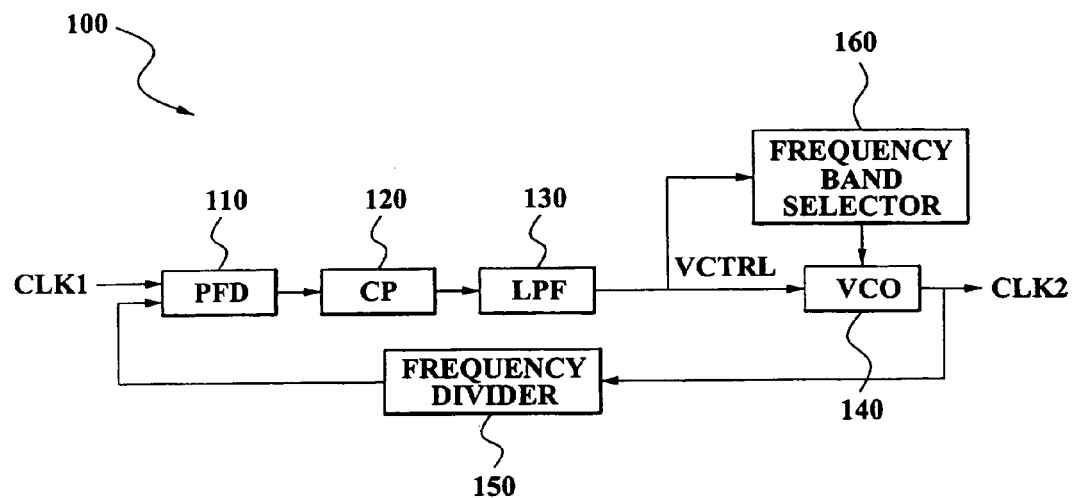
FIG. 1 is a block diagram illustrating the inner construction of a related art PLL.
Figure 2:
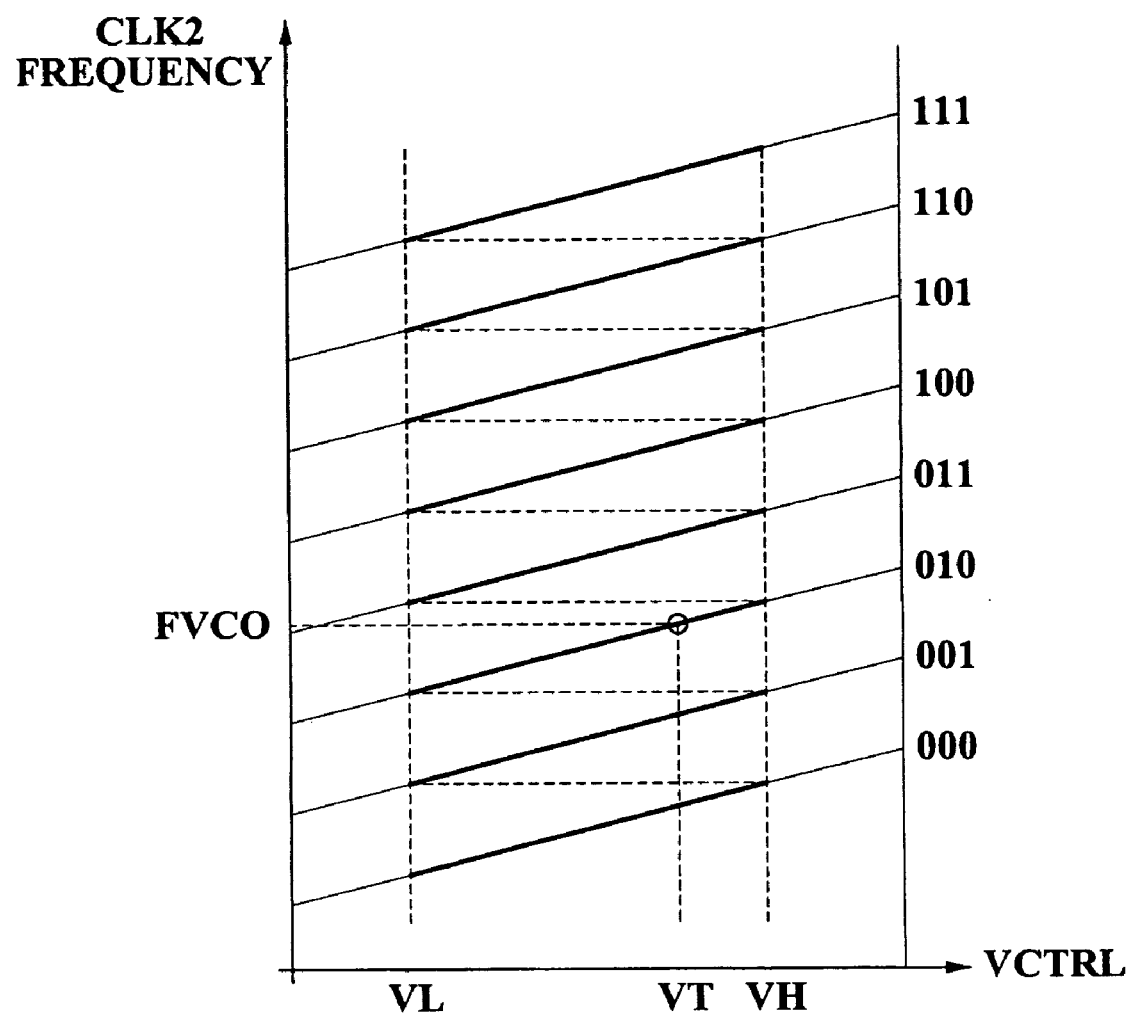
FIG. 2 is a graph illustrating the operating frequency band of a VCO shown in FIG. 1.
Figure 3:
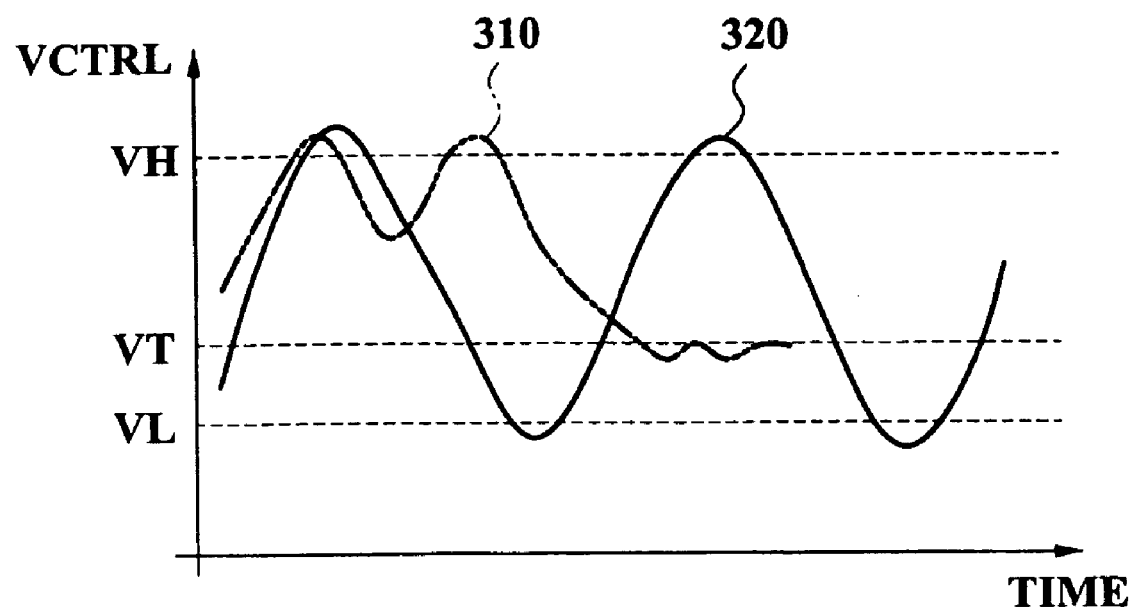
FIG. 3 is a timing diagram illustrating an unstable frequency band selection of the VCO shown in FIG. 1.

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

Figure 4:
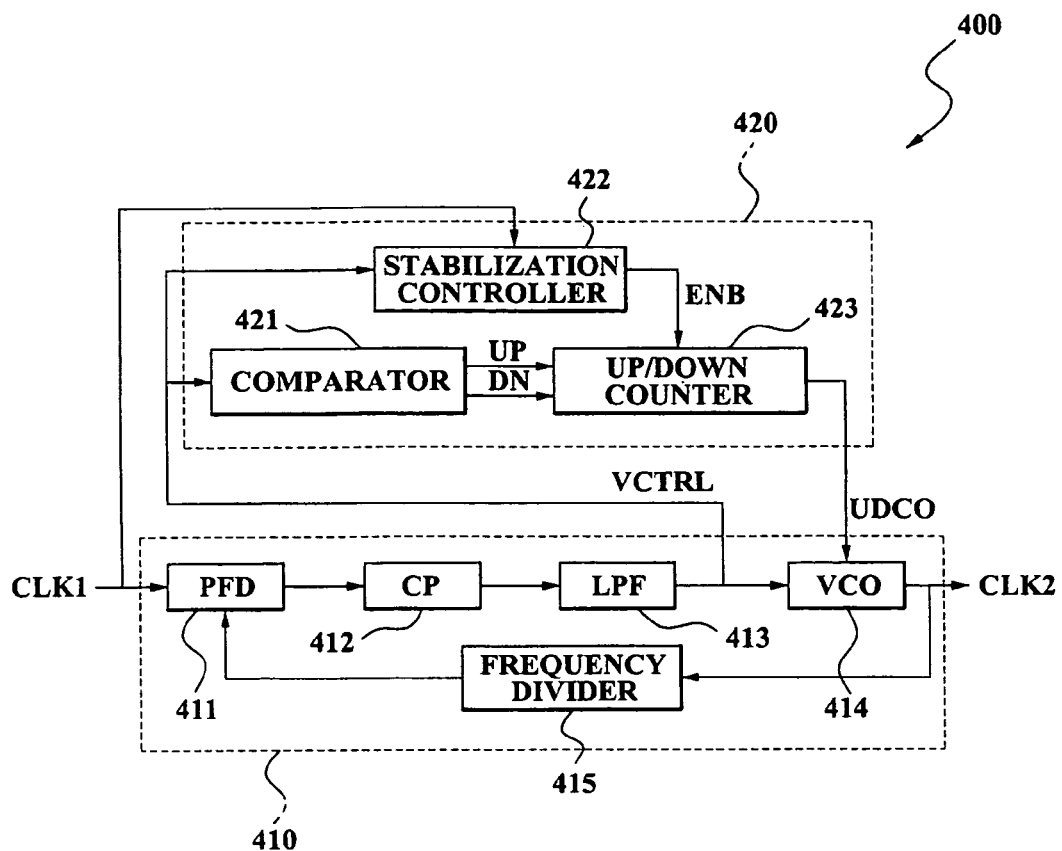
FIG. 4 is a block diagram illustrating the inner construction of a PLL according to one exemplary embodiment of the present invention.

FIG. 4 is a block diagram of the inner construction of a PLL according to one exemplary embodiment of the present invention.

Referring to FIG. 4, the PLL 400 includes a basic PLL circuit 410 and a frequency band controller 420.

The PLL 400 is designed so that the frequency band controller 420 alters the operating frequency band in consideration of the response time of the basic PLL circuit 410. Also, the PLL 400 is designed to have a sufficiently stable operating frequency band regardless of a manufacturing condition when a circuit is fabricated in slightly different environments, operation temperatures or the like. Accordingly, the PLL 400 is applied to a frequency synthesizer of wireless communication systems such as cellular phones, digital multimedia broadcasting (DMB) phones, personal digital assistants (PDAs), etc., requiring stable phase-locking within a wide frequency range, thereby improving performance of the systems. Both the basic PLL circuit 410 and the frequency band controller 420 may be configured as digital circuits.

The basic PLL circuit 410 includes a PFD 411, a CP 412, an LPF 413, a VCO 414, and a frequency divider 415.

The basic PLL circuit 410 receives an input clock signal CLK1 and the VCO 414 generates an output clock signal CLK2 that is phase-locked to a frequency higher or lower than that of the input clock signal CLK1. The PFD 411 compares the input clock signal CLK1 with an output signal which is fed back thereto from the VCO 414 via the frequency divider 415, and generates a comparison result output signal in accordance with the phase and frequency difference between the input clock signal CLK1 and the output signal. The CP 412 generates a charge pump output signal, which is lowered or raised depending on whether the comparison output signal of the PFD 411 is high or low, for application to the LPF 413 which subsequently generates an oscillation control signal VCTRL which is proportional to the phase difference.

The VCO 414 oscillates in response to the oscillation control signal VCTRL generated from the LPF 413, and changes an oscillation frequency band depending on a frequency band selection digital value UDCO generated from the frequency band controller 420 to thereby generate an output clock signal CLK2 whose frequency is phase-locked at a certain target frequency FVCO.

The VCO 414 may be configured in various forms which can alter the oscillation frequency band depending on the frequency band selection digital value UDCO. Particularly, the VCO 414 may be an oscillator using an inductor-capacitor, and may be a circuit (not shown) of the type which can change the capacitance value depending on the frequency band selection digital value UDCO to alter the oscillation frequency band.

Figure 8:
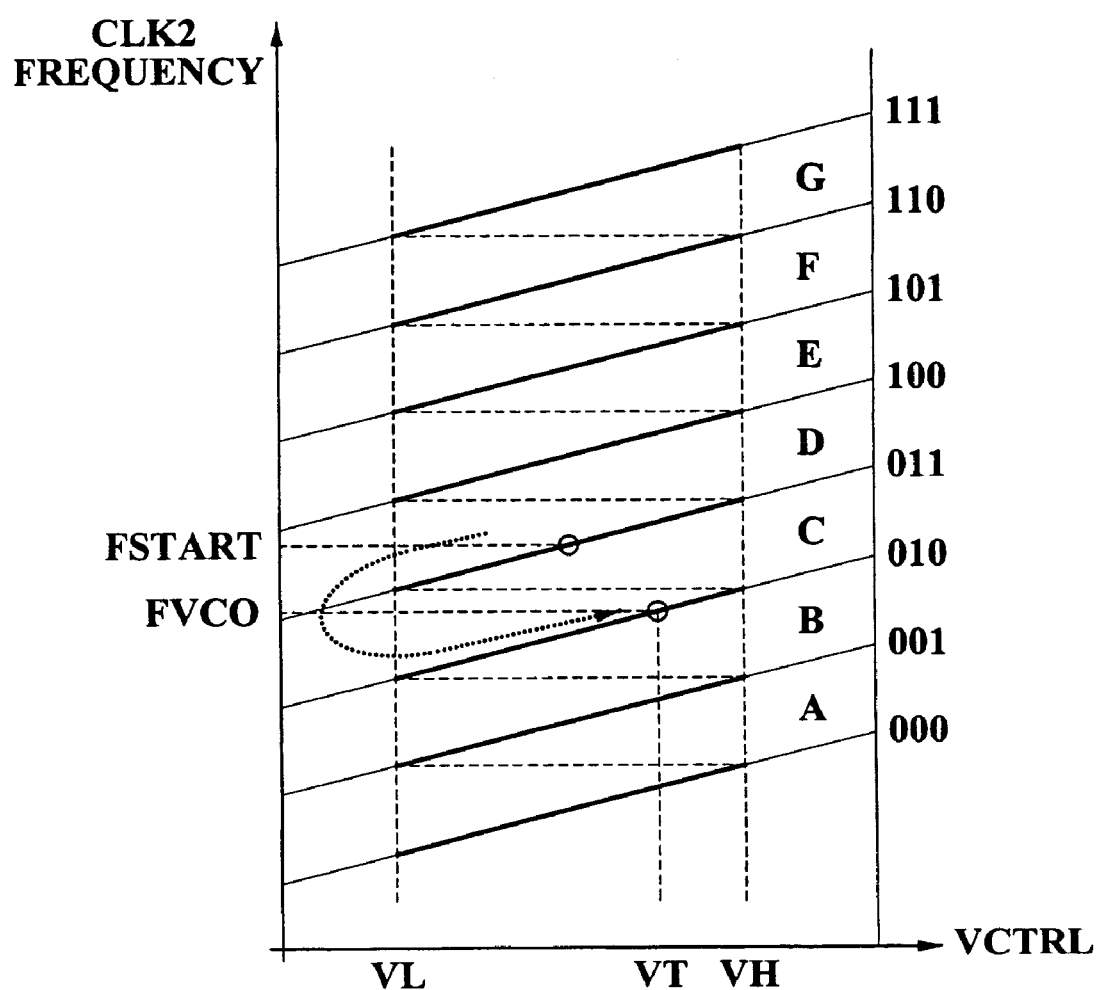
FIG. 8 is a graph illustrating the operating frequency band of a VCO shown in FIG. 4 for explaining FIG. 7.

The frequency band controller 420 decides the frequency band selection digital value in response to the input clock signal CLK1 and the oscillation control signal VCTRL. That is, the frequency band of the output clock signal CLK2 from the VCO 414 is determined by the output digital values 000 to 111 of the frequency band controller 420 depending on the oscillation control signal VCTRL. As shown in FIG. 8, when the oscillation control signal VCTRL output from the LPF 413 reaches a target voltage VT, the frequency of the output clock signal CLK2 is phase-locked at a target frequency FVCO.

In FIG. 4, the frequency band controller 420 includes a comparator 421, a stabilization controller 422, and an up/down counter 423.

Figure 5:
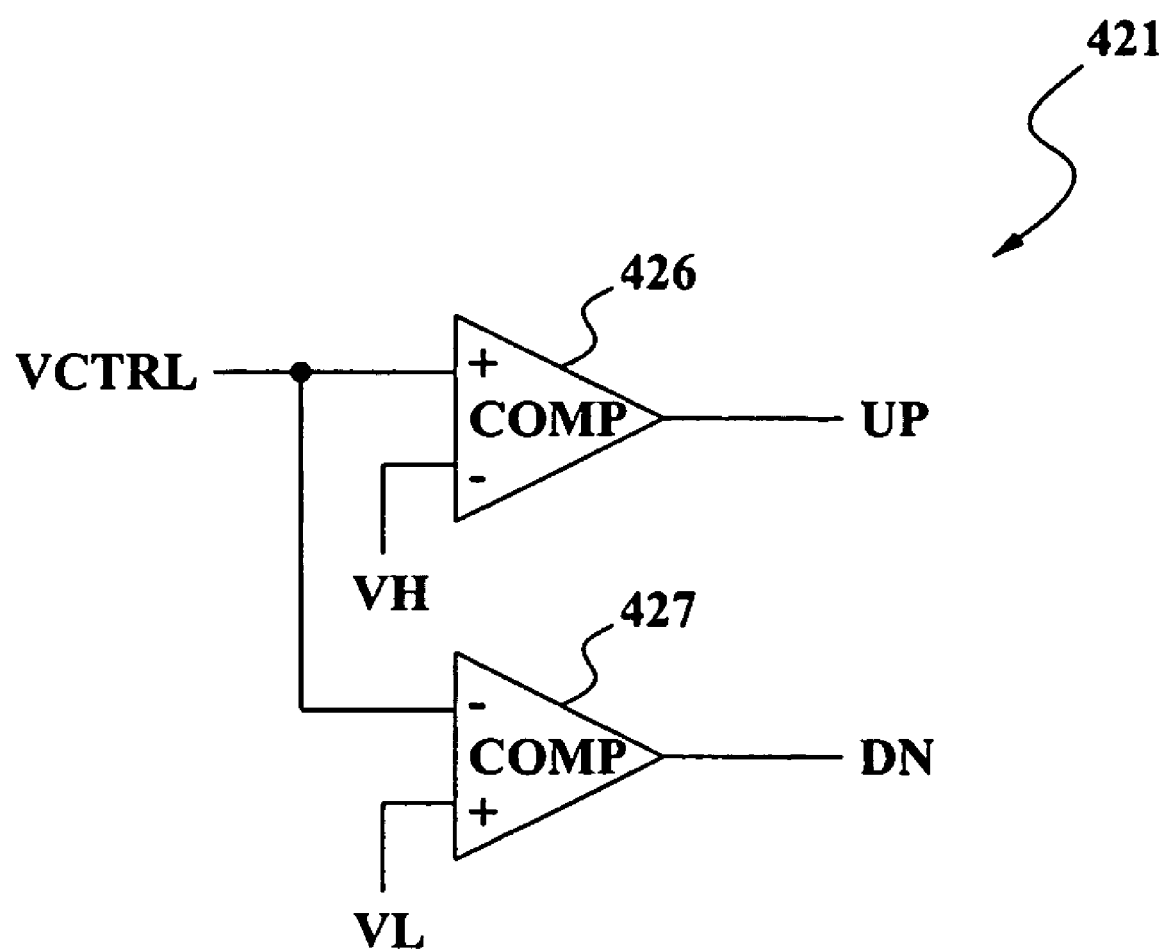
FIG. 5 is a schematic view illustrating an example of the inner construction of a comparator shown in FIG. 4.

FIG. 5 is a schematic view illustrating an example of the inner construction of the comparator 421 shown in FIG. 4.

Figure 7:
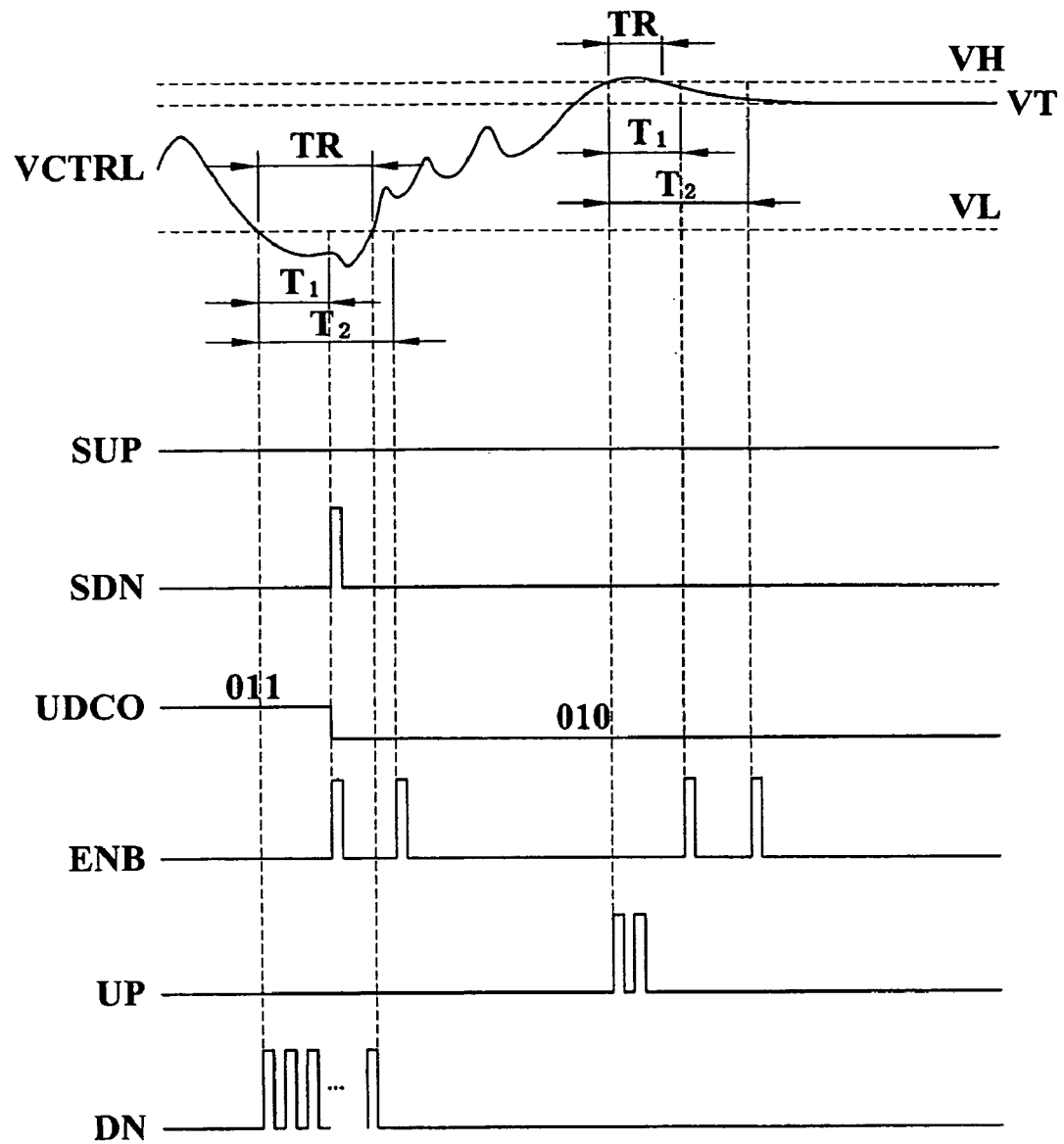
FIG. 7 is a timing diagram illustrating the operation of the PLL shown in FIG. 4.

Referring to FIG. 5, the comparator 421 includes a first comparator circuit 426 and a second comparator circuit 427. The first comparator circuit 426 compares the oscillation control signal VCTRL with a first reference voltage VH to generate an up-count signal UP according to a comparison result. The second comparator circuit 427 compares the oscillation control signal VCTRL and a second reference voltage VL to generate a down-count signal DN according to a comparison result. The first comparator circuit 426 and the second comparator circuit 427 may be a digital circuit which processes the oscillation control signal VCTRL, the first reference voltage VH and the second reference voltage VL that all have digital values. In FIG. 7, there are shown the oscillation control signal VCTRL, the first reference voltage VH and the second reference voltage VL which all are analog signals, but they may be certain digital values. In addition, the up-count signal UP generated from the comparator 421 may be a signal which is activated from a low logic level to a high logic level by a corresponding width at an interval where the oscillation control signal VCTRL is higher than the first reference voltage VH, but as shown in FIG. 7, may be generated in a form of pulses which are activated in a certain clock cycle within the interval having the corresponding width. Also, the down-count signal DN generated from the comparator 421 may be a signal which is activated from a low logic level to a high logic level by a corresponding width at an interval where the oscillation control signal VCTRL is lower than the second reference voltage VL, but as shown in FIG. 7, may be generated in a form of pulses which are activated in a certain clock cycle within the interval having the corresponding width.

In FIG. 4, the stabilization controller 422 generates an enable signal ENB for updating an operating frequency region of the VCO 414 in response to the input clock signal CLK1 and the oscillation control signal VCTRL. The stabilization controller 422 will be described in more detail with reference to FIG. 6.

The up/down counter 423 selectively outputs the up-count signal UP applied thereto from the comparator 421 in response to the enable signal ENB so that it increments the frequency band selection digital value UDCO only in response to the output up-count signal (or pulse) UP. Also, the up/down counter 423 selectively outputs the down-count signal DN applied thereto from the comparator 421 in response to the enable signal ENB so that it decrements the frequency band selection digital value UDCO only in response to the output down-count signal (or pulse) DN.

As such, the up/down counter 423 does not alter the frequency band selection digital value UDCO immediately in response to the up-count signal UP or the down-count signal DN generated from the comparator 421, but selectively outputs any one of the up-count signal UP and the down-count signal DN generated from the comparator 421 to alter the frequency band selection digital value UDCO under the control of the stabilization controller 422. Accordingly, as shown in FIG. 7, although the oscillation control signal VCTRL has a ringing/fluctuating characteristic, the VCO 414 stably alters the operating frequency band to phase-lock the frequency of the output clock signal CLK2 depending on the frequency band selection digital value UDCO output from the up/down counter 423.

Figure 6:
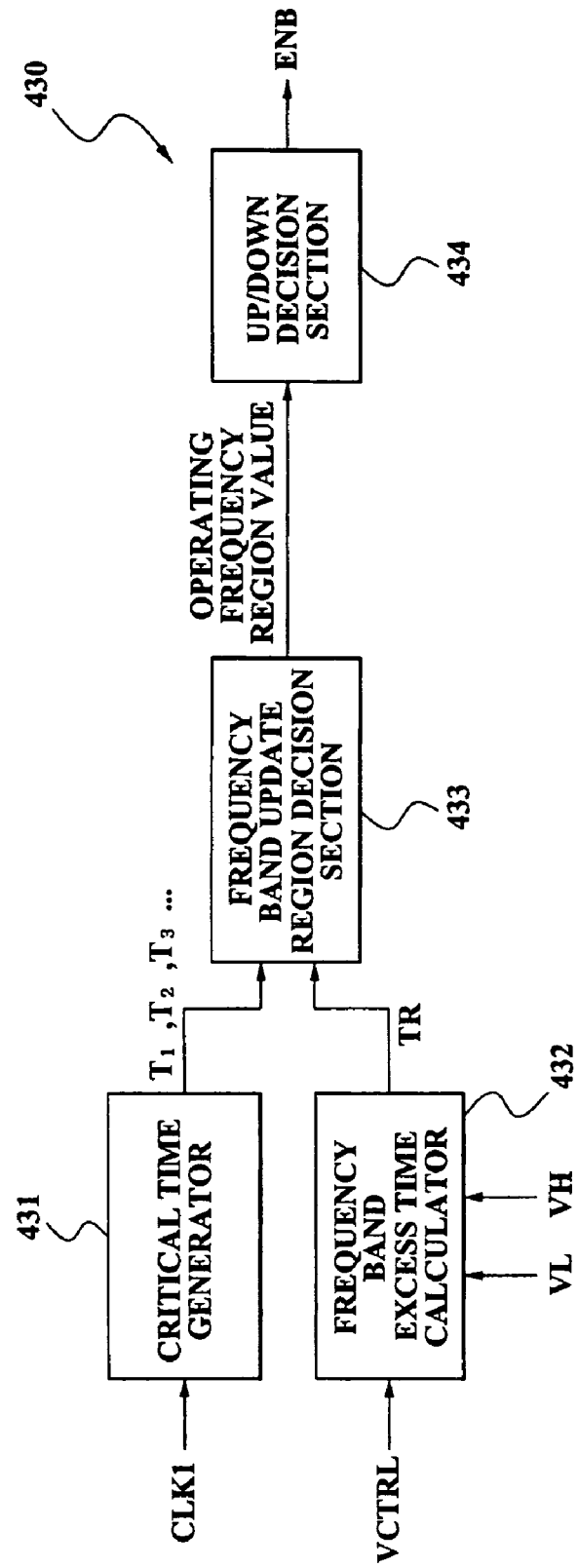
FIG. 6 is a detailed block diagram illustrating the inner construction of a stabilization controller shown in FIG. 4.

FIG. 6 is a detailed block diagram illustrating the inner construction of the stabilization controller 422 shown in FIG. 4.

Referring to FIG. 6, the stabilization controller 422 includes a critical time generator 431, a frequency band excess time calculator 432, a frequency band update region decision section 433 and an up/down decision section 434.

The critical time generator 431 counts pulses of the input clock signal CLK1 to generate critical time periods T1, T2, T3, . . . . In this case, at least one critical time period may be set. The input clock signal CLK1 is of a pulse form having a certain frequency. The critical time generator 431 can count the number of these pulses to generate critical time periods T1, T2, T3, . . . having a certain period. The critical time periods T1, T2, T3, . . . may be of the form of a signal having a high logic level pulse width of a predetermined corresponding period. Although the critical time periods T1, T2, T3, . . . may be generated in the form of a digital value corresponding to the certain pulse width, it is not limited to thereto.

The frequency band excess time calculator 432 calculates an interval TR where the oscillation control signal VCTRL is higher than the first reference voltage VH or an interval TR where the oscillation control signal VCTRL is lower than the second reference voltage VL. In this case, the calculated interval TR may be of the form of a signal having a high logic level pulse width of a predetermined corresponding period. Although the calculated interval TR may be generated in the form of a digital value corresponding to the certain pulse width, it is not limited to thereby.

The frequency band update decision section 433 compares the critical time periods T1, T2, T3, . . . generated from the critical time generator 431 with the interval TR calculated in the frequency band excess time calculator 432 to decide the operating frequency region of the VCO 414 to be updated according to the comparison result. For example, referring to FIG. 7, when the calculated interval TR is shorter than a first critical period T1, the band region value for maintaining an operating frequency band C shown in FIG. 8 is decided. In FIG. 8, it has been assumed that this instance of the VCO 414 begins to operate at a frequency FSTART within the region C of the operating frequency band. Also, when the calculated interval TR is longer than the first critical period T1 and is shorter than a second critical period T2, the band region value is decided so that the band region is altered to the region D of the operating frequency band. Similarly, the band region value may be decided so that the band region is altered to the region A, etc., depending on the duration of the calculated interval TR.

The up/down decision section 434 generates the enable signal ENB which is activated at a certain time point when the oscillation control signal VCTRL goes beyond a corresponding frequency region based on the operating frequency regions of the VCO 414 decided in the frequency band update decision section 433. For example, referring to FIG. 7, the enable signal ENB, which is activated at the time points of the critical time periods T1, T2, T3, . . . , is generated.

Accordingly, the up/down counter 423 does not alter the frequency band selection digital value UDCO immediately in response to the up-count signal UP or the down-count signal DN generated from the comparator 421. The up/down counter 423 selects a high logic level of the up-count signal UP or the down-count signal DN in an interval when the enable signal ENB is activated. At this time, the up/down counter 423 increments the frequency band selection digital value UDCO only in response to the selected up-count signal (or pulse) SUP, or decrements the frequency band selection digital value UDCO only in response to the selected down-count signal (or pulse) SDN. As shown in FIG. 7, in the case where the enable signal ENB is activated in the first critical period T1 and the second critical period T2, the frequency band selection digital value UDCO is altered from 011 indicating the start region C of the operating frequency band to 010 indicating the region B of the operating frequency band at a time point when the up-count signal UP is selected only in the first critical period T1. At this time, the frequency of the output clock signal CLK2 of the VCO 414 can be phase-locked at the target frequency FVCO. As such, it can be understood that the enable signal ENB is activated at a certain time point when the oscillation control signal VCTRL goes beyond a corresponding frequency region.

Figure 9:
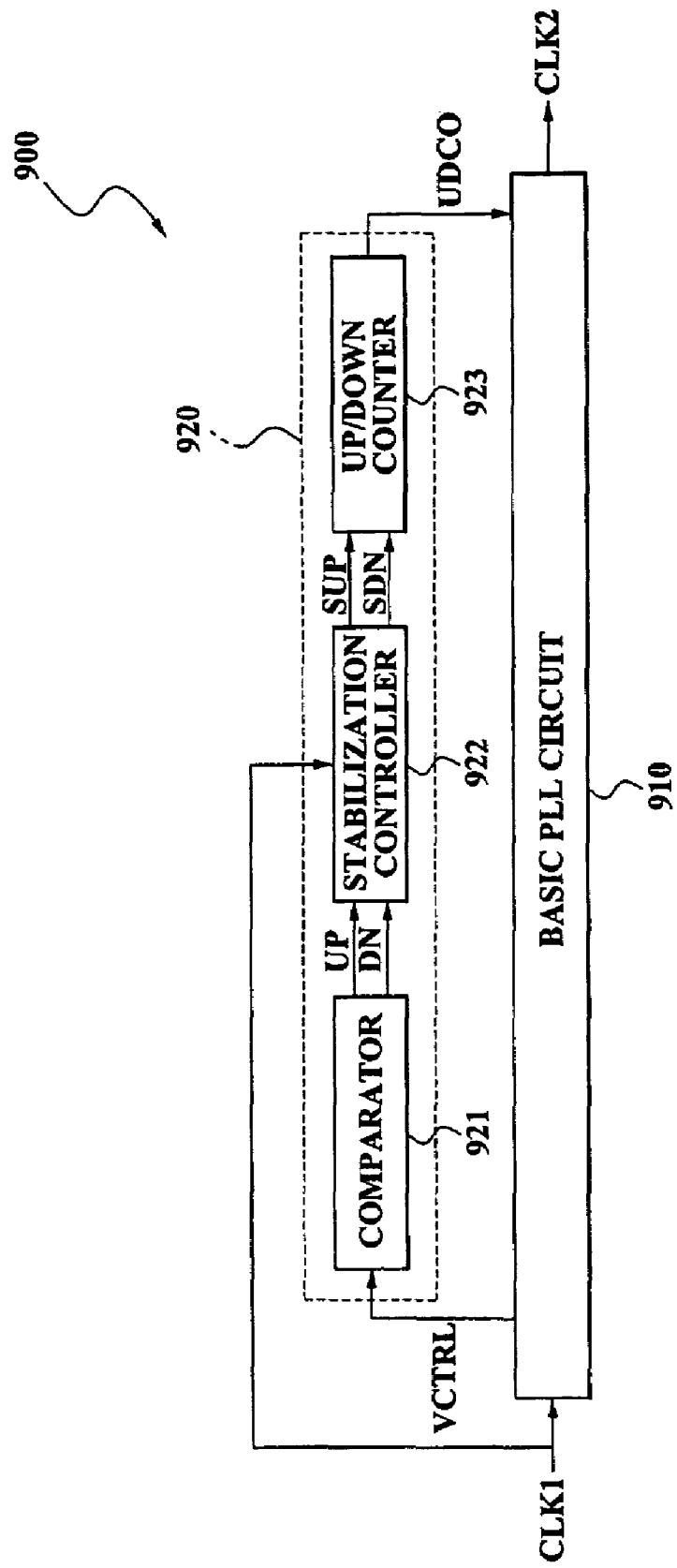
FIG. 9 is a block diagram illustrating the inner construction of a PLL according to another exemplary embodiment of the present invention.

FIG. 9 is a block diagram illustrating the inner construction of a PLL according to another exemplary embodiment of the present invention.

Referring to FIG. 9, the PLL 900 includes a basic PLL circuit 910 and a frequency band controller 920.

The basic PLL circuit 910 includes a PFD, a CP, an LPF and a VCO, and is operated in a similar manner as that of the basic PLL circuit 410 shown in FIG. 4. The basic PLL circuit 910 receives an input clock signal CLK1 and the VCO generates an output clock signal CLK2 that is phase-locked to a frequency higher or lower than that of the input clock signal CLK1. The PFD of the basic PLL circuit 910 generates an oscillation control signal VCTRL which is proportional to the output of the CP. The VCO within the basic PLL circuit 910 oscillates in response to the oscillation control signal VCTRL and changes an oscillation frequency band depending on a frequency band selection digital value UDCO generated from the frequency band controller 920 to thereby generate an output clock signal which is phase-locked at a certain target frequency FVCO.

The frequency band controller 920 decides the frequency band selection digital value UDCO in response to the input clock signal CLK1 and the oscillation control signal VCTRL.

In FIG. 9, the frequency band controller 920 includes a comparator 921, a stabilization controller 922 and an up/down counter 923.

The comparator 921 is operated in a similar manner as that of the comparator 421 shown in FIG. 5. That is, the comparator 921 compares the oscillation control signal VCTRL with a first reference voltage VH to generate an up-count signal UP according to a comparison result, and compares the oscillation control signal VCTRL with a second reference voltage VL to generate a down-count signal DN according to a comparison result.

The stabilization controller 922 generates one or more critical time periods T1, T2, T3, . . . on a basis of the input clock signal CLK1, and selectively outputs a part of the up-count signal SUP and selectively outputs a part of the down-count signal SDN depending on the generated critical time periods.

Figure 10:
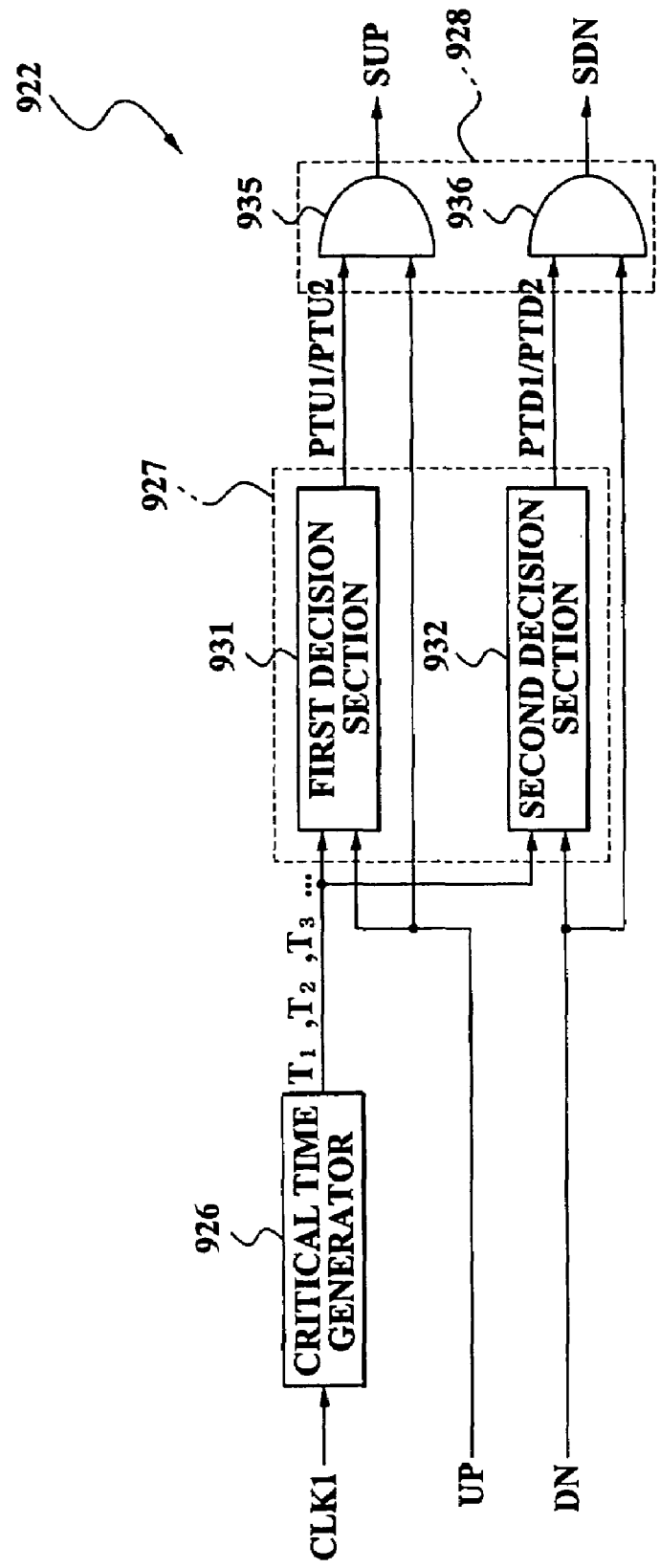
FIG. 10 is a detailed block diagram illustrating the inner construction of a stabilization controller shown in FIG. 9.

FIG. 10 is a detailed block diagram illustrating the inner construction of the stabilization controller 922 shown in FIG. 9.

Referring to FIG. 10, the stabilization controller 922 includes a critical time generator 926, a frequency band update region decision section 927 and an up/down decision section 928.

The critical time generator 926 is operated in a similar manner as that of the critical time generator 431 shown in FIG. 6. That is, the critical time generator 926 counts pulses of the input clock signal CLK1 to generate the one or more critical time periods T1, T2, T3, . . . .

Figure 11:
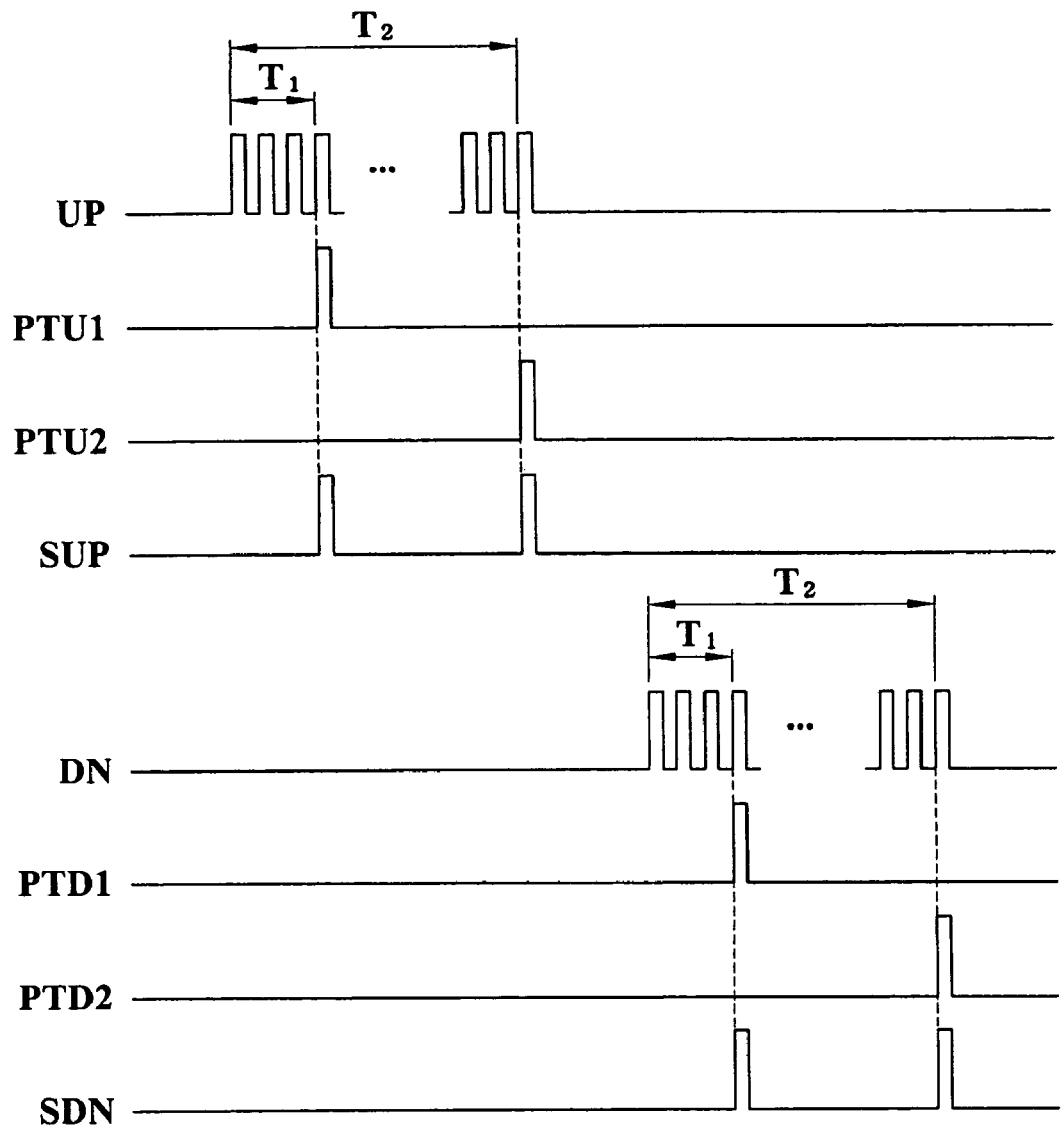
FIG. 11 is a timing diagram illustrating the operation of the stabilization controller shown in FIG. 9.

The frequency band update region decision section 927 includes a first decision section 931 and a second decision section 932. The first decision section 931 generates a signal which is activated after the generated one or more critical time periods T1, T2, T3, . . . from a time point when the up-count signal UP generated from the comparator 921 is activated. For example, as shown in FIG. 11, the first decision section 931 may generate a signal PTU1 which is activated after a first critical time period T1 from a time point when the up-count signal UP is activated. Also, the first decision section 931 may generate a signal PTU2 which is activated after a second critical time period T2 from a time point when the up-count signal UP is activated. Besides these, similarly, the first decision section 931 may generate signals which are activated after a third critical time period T3 longer than the second critical time period T2 from a time point when the up-count signal UP is activated.

Similarly, the second decision section 932 generates a signal which is activated after the one or more critical time periods T1, T2, T3, . . . from a time point when the down-count signal DN is activated. For example, as shown in FIG. 11, the second decision section 932 may generate a signal PTD1 which is activated after a first critical time period T1 from a time point when the down-count signal DN is activated. Also, the second decision section 932 may generate a signal PTD2 which is activated after a second critical time period T2 from a time point when the down-count signal DN is activated. Similarly, the second decision section 932 may generate signals which are activated after a third critical time period T3 longer than the second critical time period T2 from a time point when the down-count signal UP is activated.

As such, the frequency band update region decision section 927 generates a signal which is activated after the one or more critical time periods T1, T2, T3, . . . from a time point when the up-count signal UP or the down-count signal DN is activated.

The up/down decision section 928 selectively outputs an up-count signal SUP depending on the output of the frequency band update decision section 927 by using a first logic gate 935. Also, the up/down decision section 928 selectively outputs a down-count signal SDN depending on the output of the frequency band update decision section 927 by using a second logic gate 936. The first logic gate 935 may be an AND logic gate for each of the outputs PTU1, PTU2, . . . of the frequency band update decision section 927 and the up-count signal UP. The second logic gate 936 may be an AND logic gate for each of the outputs PTD1, PTD2, . . . of the frequency band update decision section 927 and the down-count signal DN.

Accordingly, the up/down counter 923 may increment the frequency band selection digital value UDCO only in response to the up-count signal SUP selected in the up/down decision section 928. Also, the up/down counter 923 may decrement the frequency band selection digital value UDCO only in response to the down-count signal SDN selected in the up/down decision section 928.

As such, the frequency band controller 920 of the PLL 900 according to another exemplary embodiment of the present invention is also operated in a similar manner as that of the frequency band controller 420 shown in FIG. 4.

The frequency band controller 920 does not alter the frequency band selection digital value UDCO immediately in response to the up-count signal UP or the down-count signal DN generated from the comparator 421, but alters the frequency band selection digital value UDCO selectively according to either the up-count signal UP or the down-count signal DN generated from the comparator 421. Accordingly, although the oscillation control signal VCTRL has a ringing/fluctuating characteristic, the VCO 414 in the basic PLL circuit 910 stably alters the operating frequency band to phase-lock the frequency of the output clock signal CLK2 depending on the frequency band selection digital value UDCO output from the up/down counter 923.

As described above, in the PLLs 400 and 900 according to the present invention, the frequency band controllers 420 and 920 alter the frequency band selection digital value UDCO in response to the input clock signal CLK1 and the oscillation control signal VCTRL generated from the LPF 413. Accordingly, the VCO 414 of the basic PLL circuit 410 changes the frequency of the output clock signal CLK2 depending on the oscillation control signal VCTRL and the frequency band selection digital value UDCO. The output clock signal CLK2 is rapidly and stably phase-locked at a target frequency FVCO depending on the frequency band selection digital value UDCO.

As apparent from the foregoing, in the PLL according to the present invention, since the output frequency band of the VCO is stably adjusted, it is possible to secure stability of the phase-locking of the output clock signal of the VCO within a sufficient operating frequency band of the VCO so as to be adopted regardless of a fabricating process or an operation temperature of a circuit. The PLL according to the present invention is applied to a frequency synthesizer of wireless communication systems such as cellular phones, DMB phones, PDAs, etc., requiring stable phase-locking within a wide frequency range, thereby improving the performance of the systems.

The function used in the PLL and the phase locking method disclosed herein can be implemented by storing a code readable by a computer in a computer-readable recording medium. The computer-readable recording medium includes all kinds of recording devices which stores therein data readable by a computer system. Examples of the computer-readable recording medium include ROMs, RAMs, CD-ROMs, magnetic tapes, floppy disks, optical data storage units, etc. Also, the computer-readable recording medium may include devices which are implemented in the form of carrier waves (for example, transmission through the Internet). In addition, the computer-readable recording medium stores therein a code which is distributed in a computer system connected to a wireless/wired communication network and can be read by a computer in a distribution manner, and can be executed by the code.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A phase-locked loop comprising:
   a basic phase-locked loop circuit comprising a voltage-controlled oscillator (VCO), the basic phase-locked loop circuit generating an output clock signal which is phase-locked with an input clock signal using the VCO which oscillates in response to an oscillation control signal and changes an oscillation frequency band depending on a frequency band selection digital value; and
   a frequency band controller which generates the frequency band selection digital value in response to the input clock signal and the oscillation control signal,
   wherein the frequency band controller comprises:
   a comparator which compares the oscillation control signal with a first reference voltage to generate an up-count signal, and compares the oscillation control signal with a second reference voltage to generate a down-count signal;
   a stabilization controller which generates an enable signal to update an operating frequency region of the VCO in response to the input clock signal and the oscillation control signal; and
   a counter which receives the up-count signal and the down-count signal from the comparator, selectively outputs the up-count signal in response to the enable signal so as to increment the frequency band selection digital value, and selectively outputs the down-count signal in response to the enable signal so as to decrement the frequency band selection digital value.

2. The phase-locked loop of claim 1, wherein the stabilization controller calculates an interval where the oscillation control signal is higher than the first reference voltage or lower than the second reference voltage, and determines the operating frequency region of the VCO to be updated according to a calculation result to thereby generate the enable signal to select one of the down-count signal and the up-count signal.

3. The phase-locked loop of claim 2, wherein the stabilization controller counts the input clock signal to generate at least one critical time period, and compares the generated at least one critical time period with the calculated interval to determine the operating frequency region of the VCO.

4. The phase-locked loop of claim 3, wherein the stabilization controller generates the enable signal which is activated at a certain time point if the oscillation control signal goes beyond a corresponding frequency region based on the determined operating frequency region of the VCO.

5. The phase-locked loop of claim 1, wherein the stabilization controller comprises:
   a critical time generator which counts the input clock signal to generate at least one critical time period;
   a frequency band excess time calculator which calculates an interval where the oscillation control signal is higher than the first reference voltage or lower than the second reference voltage;

a frequency band update decision section which determines the operating frequency region of the VCO to be updated according to the generated at least one critical time period and the calculated interval; and a decision section which generates the enable signal which is activated at a certain time point if the oscillation control signal goes beyond a corresponding frequency region based on the determined operating frequency region of the VCO.

6. The phase-locked loop of claim 1, wherein each of the basic PLL circuit and the frequency band controller is a digital circuit.

7. A phase-locked loop of comprising:
a basic phase-locked loop circuit comprising a voltage-controlled oscillator (VCO), the basic phase-locked loop circuit generating an output clock signal which is phase-locked with an input clock signal using the VCO which oscillates in response to an oscillation control signal and changes an oscillation frequency band depending on a frequency band selection digital value; and
a frequency band controller which generates the frequency band selection digital value in response to the input clock signal and the oscillation control signal,
wherein the frequency band controller comprises:
a comparator which compares the oscillation control signal and a first reference voltage to generate an up-count signal, and compares the oscillation control signal and a second reference voltage to generate a down-count signal;
a stabilization controller which selectively outputs a part of the up-count signal and selectively outputs a part of the down-count signal depending on at least one critical time period generated on a basis of the input clock signal; and
a counter which increments the frequency band selection digital value in response to the output up-count signal and decrements the frequency band selection digital value in response to the output down-count signal.

8. The phase-locked loop of claim 7, wherein the stabilization controller comprises:
a critical time generator which counts the input clock signal to generate at least one critical time period;
a frequency band update decision section which generates a signal which is activated after the generated at least one critical time period from a time point when if the up-count signal or the down-count signal is activated; and
a decision section which selectively outputs the up-count signal or selectively outputs the down-count signal depending on the signal generated by the frequency band update decision section.

9. The phase-locked loop of claim 8, wherein the frequency band update decision section comprises:
a first decision section which generates a first signal which is activated after the generated at least one critical time period from a time point when the up-count signal is activated; and
a second decision section which generates a second signal which is activated after the generated at least one critical time period from a time point when the down-count signal is activated.

10. A method of phase-locking an input clock signal using a voltage-controlled oscillator (VCO) which is operated in response to an oscillation control signal and a frequency band selection digital value, the method comprising:
receiving the input clock signal;
processing, using the VCO, the input clock signal and an output clock signal which is fed back from the VCO to generate the oscillation control signal;
deciding the frequency band selection digital value in response to the input clock signal and the oscillation control signal; and
changing an oscillation frequency band of the VCO depending on the decided frequency band selection digital value to thereby generate the output clock signal having a frequency which is phase-locked at a certain target frequency,
wherein the deciding the frequency band selection digital value comprises:
comparing the oscillation control signal and a first reference voltage to generate an up-count signal, and comparing the oscillation control signal and a second reference voltage to generate a down-count signal;
generating an enable signal to update an operating frequency region of the VCO in response to the input clock signal and the oscillation control signal; and
selectively outputting the up-count signal in response to the enable signal so as to increment the frequency band selection digital value in response to the output up-count signal; and
selectively outputting the down-count signal in response to the enable signal so as to decrement the frequency band selection digital value in response to the output down-count signal.

11. The method of claim 10, wherein the generating the enable signal comprises:
calculating an interval where the oscillation control signal is higher than the first reference voltage or lower than the second reference voltage, and determining the operating frequency region of the VCO to be updated according to a calculation result; and
generating the enable signal to select either the down-count signal or the up-count signal depending on the determined operating frequency region.

12. The method of claim 11 further comprising:
counting the input clock signal to generate at least one critical time period; and
comparing the generated at least one critical time period with the calculated interval to determine the operating frequency region of the VCO.

13. The method of claim 12 further comprising generating the enable signal which is activated at a certain time point of when the oscillation control signal goes beyond a corresponding frequency region based on the decided operating frequency region of the VCO.

14. A method of phase-locking an input clock signal using a voltage-controlled oscillator (VCO) which is operated in response to an oscillation control signal and a frequency band selection digital value, the method comprising:
receiving the input clock signal;
processing, using the VCO, the input clock signal and an output clock signal which is fed back from the VCO to generate the oscillation control signal;
deciding the frequency band selection digital value in response to the input clock signal and the oscillation control signal; and
changing an oscillation frequency band of the VCO depending on the decided frequency band selection digital value to thereby generate the output clock signal having a frequency which is phase-locked at a certain target frequency,
wherein the deciding the frequency band selection digital value comprises:

comparing the oscillation control signal and a first reference voltage to generate an up-count signal, and comparing the oscillation control signal and a second reference voltage to generate a down-count signal;

selectively outputting a part of the up-count signal and selectively outputting a part of the down-count signal depending on at least one critical time period generated on a basis of the input clock signal;

incrementing the frequency band selection digital value in response to the output up-count signal; and decrementing the frequency band selection digital value in response to the output down-count signal.

15. The method of claim 14, wherein the selectively outputting the part of the up-count signal and selectively outputting the part of the down-count signal depending on the at least one critical time period generated on the basis of the input clock signal comprises:

counting the input clock signal to generate at least one critical time period;

generating a signal which is activated after the generated at least one critical time period, from a time point when the up-count signal or the down-count signal is activated;

selectively outputting the up-count signal depending on the activated signal; and selectively outputting the down-count signal depending on the activated signal.

16. A computer readable recording medium storing a program for realizing a method of phase-locking an input clock signal using a voltage-controlled oscillator (VCO) which is operated in response to an oscillation control signal and a frequency band selection digital value, the method comprising:

receiving the input clock signal;

processing, using the VCO, the input clock signal and an output clock signal which is fed back from the VCO to generate the oscillation control signal;

deciding the frequency band selection digital value in response to the input clock signal and the oscillation control signal; and changing an oscillation frequency band of the VCO depending on the decided frequency band selection digital value to thereby generate the output clock signal having a frequency which is phase-locked at a certain target frequency, wherein the deciding the frequency band selection digital value comprises:

comparing the oscillation control signal and a first reference voltage to generate an up-count signal, and comparing the oscillation control signal and a second reference voltage to generate a down-count signal;

selectively outputting a part of the up-count signal and selectively outputting a part of the down-count signal depending on at least one critical time period generated on a basis of the input clock signal;

incrementing the frequency band selection digital value in response to the output up-count signal; and decrementing the frequency band selection digital value in response to the output down-count signal.

* * * * *